United States Patent [19]
Takahashi

[11] Patent Number: 5,105,192
[45] Date of Patent: Apr. 14, 1992

[54] METHOD AND APPARATUS FOR DETECTING A SAMPLING-PERIOD SYNC SIGNAL FROM AN OUTPUT SIGNAL OF A DIGITAL-TO-ANALOG CONVERTER

[75] Inventor: Susumu Takahashi, Tokyo, Japan

[73] Assignee: Victor Company of Japan, Ltd., Yokohama, Japan

[21] Appl. No.: 559,062

[22] Filed: Jul. 30, 1990

[30] Foreign Application Priority Data

Sep. 20, 1989 [JP] Japan .................................. 1-244470

[51] Int. Cl.⁵ ............................................ H03M 1/00
[52] U.S. Cl. ................................ 341/110; 341/122; 341/155; 360/51; 375/118; 328/139; 307/523
[58] Field of Search ............... 341/61, 110, 122, 123, 341/144, 155; 360/32, 51; 375/14, 118, 110, 120; 307/522, 523, 527; 328/139, 155; 331/2, 25

[56] References Cited

U.S. PATENT DOCUMENTS

| | | |
|---|---|---|
| 3,614,640 | 10/1971 | Wolf .................................. 307/522 |
| 4,072,909 | 2/1978 | Citta .................................. 331/25 X |
| 4,317,212 | 2/1982 | Van Gerwen et al. ............. 341/122 |
| 4,394,626 | 7/1983 | Kurihara et al. .................. 331/25 X |
| 4,489,280 | 12/1984 | Bennett, Jr. et al. .............. 328/139 |
| 4,510,612 | 4/1985 | Scholten et al. .................. 307/527 X |
| 4,704,722 | 11/1987 | Henry .................................. 375/120 |
| 4,975,928 | 12/1990 | Horsten ............................. 375/120 X |
| 5,003,559 | 3/1991 | Kanai et al. ...................... 375/120 X |
| 5,036,409 | 9/1991 | Kaaden et al. .................... 360/51 |

Primary Examiner—Howard L. Williams
Attorney, Agent, or Firm—Pollock, VandeSande & Priddy

[57] ABSTRACT

In a method and an apparatus for detecting a sampling-period sync signal from an output signal of a digital-to-analog converter, sampling-period components are extracted from the output signal of the digital-to-analog converter. Low-frequency components of the output signal of the digital-to-analog converter are also extracted. A detection is made as to whether a level of the low-frequency components increases or decreases. A polarity of the sampling-period components is changed in response to whether the level of the low-frequency components increases or decreases.

11 Claims, 6 Drawing Sheets

METHOD AND APPARATUS FOR DETECTING A SAMPLING-PERIOD SYNC SIGNAL FROM AN OUTPUT SIGNAL OF A DIGITAL-TO-ANALOG CONVERTER

BACKGROUND OF THE INVENTION

This invention relates to a method and an apparatus for detecting a sampling-period sync signal from an output signal of a digital-to-analog converter. This invention also relates to a recording apparatus and a reproducing apparatus.

Some audio recording and reproducing devices have the function of reproducing a digital signal from a recording medium, converting the digital signal into a corresponding analog signal, and outputting the analog signal. General DATs (digital audio tape recorders) have the function of receiving an analog signal, converting the analog signal into a corresponding digital signal, and recording the digital signal into a recording medium.

In some cases, a digital signal is reproduced from a recording medium and is converted into a corresponding analog signal, and then the analog signal is converted back into a corresponding digital signal and the digital signal is recorded again into a recording medium by a DAT. In these cases, the quality of the recorded digital signal is lower than the quality of the original digital signal.

It was experimentally found that a main cause of the deterioration of the recorded digital signal was the presence of an anti-aliasing filter in these recording and reproducing devices. The anti-aliasing filter includes a low pass filter which prevents high-frequency signal components from causing aliasing during a sampling process in analog-to-digital conversion. The anti-aliasing filter is composed of either an analog filter or a digital filter. Generally, an analog-type anti-aliasing filter has poor group delay frequency characteristics which cause a degradation of a filtered signal. An FIR digital-type anti-aliasing filter has good group delay frequency characteristics but causes unwanted signal components such as pre-echoes and after-echoes.

In cases where an anti-aliasing filter is removed and the output signal from a digital-to-analog converter of a reproducing side is directly fed to an analog-to-digital converter of a recording side, a good signal quality can be ensured only when the operation of the digital-to-analog converter and the operation of the analog-to-digital converter are accurately synchronized with each other. To synchronize the analog-to-digital converter of the recording side with the digital-to-analog converter of the reproducing side, it is necessary to detect a sampling-period sync signal from an output signal of the digital-to-analog converter of the reproducing side.

SUMMARY OF THE INVENTION

It is a first object of this invention to provide a method and an apparatus for detecting a sampling-period sync signal from an output signal of a digital-to-analog converter which enable a good signal quality in signal recording and reproducing processes.

It is a second object of this invention to provide an advanced recording apparatus.

It is a third object of this invention to provide an advanced reproducing apparatus.

According to a first aspect of this invention, an apparatus for detecting a sampling-period sync signal from an output signal of a digital-to-analog converter comprises means for extracting sampling-period components from the output signal of the digital-to-analog converter; means for extracting low-frequency components of the output signal of the digital-to-analog converter; means for detecting whether a level of the low-frequency components increases or decreases and for generating a detection signal representative thereof; and means responsive to the detection signal for changing a polarity of the sampling-period components in response to whether the level of the low-frequency components increases or decreases.

According to a second aspect of this invention, an apparatus for detecting a sampling-period sync signal from an output signal of a digital-to-analog converter comprises means for extracting sampling-period components from the output signal of the digital-to-analog converter; means for generating a signal depending on whether a level of low-frequency components of the output signal of the digital-to-analog converter increases or decreases; and means for multiplying said signal and the sampling-period components.

According to a third aspect of this invention, an apparatus for detecting a sampling-period sync signal from an output signal of a digital-to-analog converter comprises a differentiating circuit differentiating the output signal of the digital-to-analog converter; and a Costas-type PLL circuit operating with an output signal from the differentiating circuit to derive a sampling-period sync signal.

According to a fourth aspect of this invention, an apparatus for detecting a sampling-period sync signal from an output signal of a digital-to-analog converter comprises a differentiating circuit differentiating the output signal of the digital-to-analog converter; and a PLL circuit operating with an output signal from the differentiating circuit to derive a sampling-period sync signal; wherein the PLL circuit comprises a voltage-controlled oscillator; a phase shifter shifting a phase of an output signal from the voltage-controlled oscillator by 90 degrees; a first multiplier multiplying an output signal from the differentiating circuit and an output signal from the phase shifter; a low pass filter processing the output signal from the differentiating circuit; a second multiplier multiplying an output signal from the first multiplier and an output signal from the low pass filter; and a loop filter processing an output signal from the second multiplier; the voltage controlled oscillator having a control terminal receiving an output signal from the loop filter.

According to a fifth aspect of this invention, a recording apparatus comprises a differentiating circuit differentiating an input analog signal; a Costas-type PLL circuit operating with an output signal from the differentiating circuit and generating a first timing signal having a period equal to a period of sampling-period components of the input analog signal; an analog-to-digital converter sampling the input analog signal in response to the first timing signal and converting the sampled input analog signal into a corresponding digital signal; a buffer memory storing the digital signal in response to the first timing signal and outputting the digital signal in response to a second timing signal; a normal-design PLL circuit generating the second timing signal on the basis of the first timing signal; and a memory within an error correction circuit for storing the digital signal outputted from the buffer memory in response to the second timing signal; wherein the second timing signal constitutes a clock signal for servo control.

According to a sixth aspect of this invention, a recording apparatus comprises means for extracting a first sampling-frequency signal from an input analog signal; means for generating a reference-frequency signal; first selecting means for selecting one of the first sampling-frequency signal and the reference-frequency signal; a PLL circuit generating a second sampling-frequency signal on the basis of the signal selected by the first selecting means; an anti-aliasing filter processing the input analog signal; second selecting means for selecting one of the input analog signal and an output signal from the anti-aliasing filter; and an analog-to-digital converter sampling the signal selected by the second selecting means in response to the second sampling-frequency signal and converting the sampled signal into a corresponding digital signal.

According to a seventh aspect of this invention, a recording apparatus comprises a differentiating circuit differentiating an input analog signal; means for generating a reference-frequency signal; first selecting means for selecting one of the first sampling-frequency signal and the reference-frequency signal; a PLL circuit generating a second sampling-frequency signal on the basis of the signal selected by the first selecting means; means of changing the PLL circuit between a normal-design PLL circuit and a Costas-type PLL circuit; an anti-aliasing filter processing the input analog signal; second selecting means for selecting one of the input analog signal and an output signal from the anti-aliasing filter; and an analog-to-digital converter sampling the signal selected by the second selecting means in response to the second sampling-frequency signal and converting the sampled signal into a corresponding digital signal.

According to an eighth aspect of this invention, a recording apparatus comprises a differentiating circuit differentiating an input analog signal; means for generating a reference-frequency signal; first selecting means for selecting one of the first sampling-frequency signal and the reference-frequency signal; a PLL circuit generating a second sampling-frequency signal on the basis of the signal selected by the first selecting means; means of changing the PLL circuit between a normal-design PLL circuit and a Costas-type PLL circuit; an anti-aliasing filter processing the input analog signal; second selecting means for selecting one of the input analog signal and an output signal from the anti-aliasing filter; an analog-to-digital converter sampling the signal selected by the second selecting means in response to the second sampling-frequency signal and converting the sampled signal into a corresponding digital signal; and means for detecting whether or not sampling-frequency components are present in the input analog signal, and for controlling the first selecting means, the second selecting means, and the PLL changing means in response to whether or not the sampling-frequency components are present in the input analog signal.

According to a ninth aspect of this invention, a reproducing apparatus comprises a digital-to-analog converter; an anti-aliasing filter processing an output signal from the digital-to-analog converter; an adder having first and second input terminals and adding signals fed to the first and second input terminals; means for selecting one of the output signal from the digital-to-analog converter and an output signal from the anti-aliasing filter, and for feeding said selected one of the output signal from the digital-to-analog converter and the output signal from the anti-aliasing filter to the first input terminal of the adder; and means for selectively enabling and inhibiting a feed of a reference signal to the second input terminal of the adder, wherein a period of the reference signal has a predetermined relation with a period of sampling in the digital-to-analog converter.

According to a tenth aspect of this invention, a reproducing apparatus comprises a digital-to-analog converter; an anti-aliasing filter processing an output signal from the digital-to-analog converter; an adder adding an output signal from the digital-to-analog converter and a reference signal of a period which has a predetermined relation with a period of sampling in the digital-to-analog converter; and means for selecting one of an output signal from the anti-aliasing filter and an output signal from the adder and for outputting said selected one of the output signal from the anti-aliasing filter and the output signal from the adder.

According to an eleventh aspect of this invention, a method of detecting a sampling-period sync signal from an output signal of a digital-to-analog converter comprises the steps of extracting sampling-period components from the output signal of the digital-to-analog converter; extracting low-frequency components of the output signal of the digital-to-analog converter; detecting whether a level of the low-frequency components increases or decreases; and changing a polarity of the sampling-period components in response to whether the level of the low-frequency components increases or decreases.

According to a twelfth aspect of this invention, a method of detecting a sampling-period sync signal from an output signal of a digital-to-analog converter comprises the steps of extracting sampling-period components from the output signal of the digital-to-analog converter; generating a signal depending on whether a level of low-frequency components of the output signal of the digital-to-analog converter increases or decreases; and multiplying said signal and the sampling-period components.

BRIEF DESCRIPTION OF THE DRAWINGS

Like and corresponding elements are denoted by the same reference characters throughout the drawings.

DESCRIPTION OF THE FIRST PREFERRED EMBODIMENT

Figure 1:
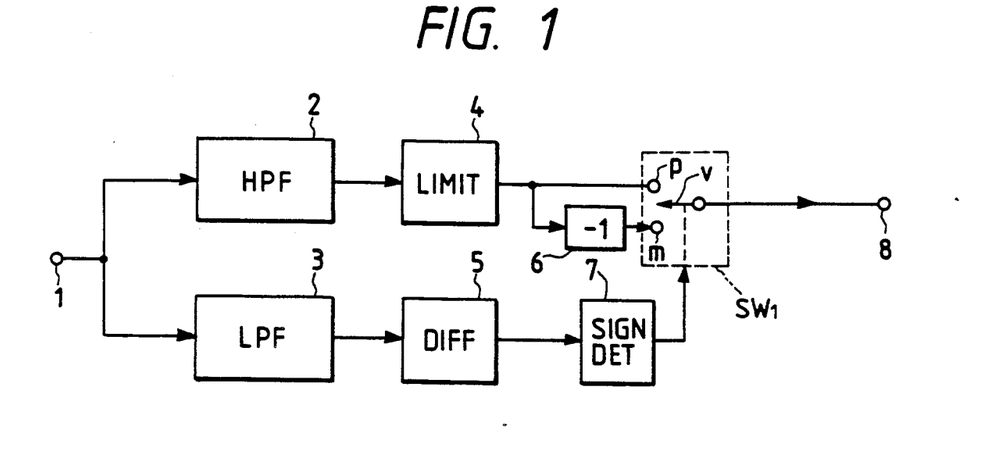
FIG. 1 is a block diagram of an apparatus according to a first embodiment of this invention.

With reference to FIG. 1, an input terminal 1 is subjected to an analog signal which is derived from a digital signal through digital-to-analog conversion. The input analog signal is basically separated into information-representing components and sampling-period components. Specifically, the analong signal is outputted from a digital-to-analog converter (not shown) and has a stepwise waveform. The analog signal is fed via the input terminal 1 to a high pass filter (HPF) 2 and a low pass filter (LPF) 3.

The pass band of the HPF 2 is designed so as to select and pass the sampling-period components of the analong signal. The amplitude of the output signal from the HPF is limited by a limiter 4. The output signal from the limiter 4 is applied to a fixed contact "p" of a switch SW1 and a polarity (sign) inverter 6. The polarity inverter 6 inverts the polarity or sign of the output signal from the limiter 4. The output signal from the polarity inverter 6 is fed to a fixed contact "m" of the switch SW1.

The LPF 3 selects and passes low-frequency components of the analog signal. For example, the cutoff frequency of the LPF 3 is set equal to or lower than a half of the sampling frequency. The output signal from the LPF 3 is differentiated by a differentiating circuit 5. In the case where the digital-to-analog converter deriving the analog signal is contained in a DAT, the output signal from the LPF 3 is an audio signal. The output signal from the differentiating circuit 5 has opposite polarities (signs) when the level of the signal fed to the differentiating circuit 5 increases and decreases respectively. The polarity or sign of the output signal from the differentiating circuit 5 is detected by a polarity detector 7. The polarity detector 7 generates a binary change control signal. the state of which depends on the polarity of the output signal from the differentiating circuit 5. The change control signal is fed to a control terminal of the switch SW1.

The switch SW1 has a removable contact "v" which contacts one of the fixed contacts "p" and "m" in response to the change control signal fed from the polarity detector 7. Thus, the switch SW1 selects one of the output signals from the limiter 4 and the polarity inverter 6 in response to the change control signal, tha is, in response to the polarity of the output signal from the differentiating circuit 5. The movable contact "v" of the switch SW1 leads to an output terminal 8. When the output signal from the differentiating circuit 5 is positive, the movable contact "v" is connected to the fixed contact "p" in response to the change control signal so that the output signal from the limiter 4 is selected and transmitted to the output terminal 8 by the switch SW1. When the output signal from the differentiating circuit 5 is negative, the movable contact "v" is connected to the fixed contact "m" in response to the change control signal so that the output signal from the polarity inverter 6 is selected and transmitted to the output terminal 8 by the switch SW1.

A main component of the resultant signal transmitted to the output terminal 8 from the switch SW1 has a period equal to the sampling period. In addition, since the opposite-polarity signals are selected by the switch SW1 when the level of the low-frequency components of the analog signal increases and decreases respectively, the phase and the waveform of the resultant signal transmitted to the output terminal 8 are essentially independent of whether the level of the low-frequency components of the analog signal increases or decreases. Thus, the resultant signal transmitted to the output terminal 8 keeps accurately representing the sampling period. Accordingly, this signal can be used as a sampling-period sync signal.

The sampling-period sync signal is fed via the output terminal 8 to a PLL (phase locked loop) circuit (not shown). The PLL circuit generates a sampling signal on the basis of the sampling-period sync signal. The sampling signal to fed to an analog-to-digital converter (not shown) for converting the analog signal into a corresponding digital signal.

DESCRIPTION OF THE SECOND PREFERRED EMBODIMENT

Figure 2:
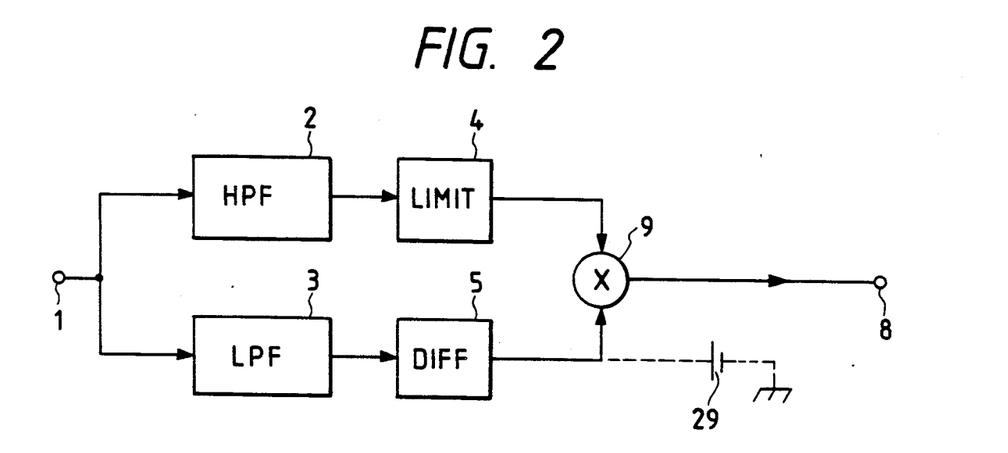
FIG. 2 is a block diagram of an apparatus according to a second embodiment of this invention.

FIG. 2 shows a second embodiment of this invention which is similar to the embodiment of FIG. 1 except for design changes indicated hereinafter. The polarity inverter 6 (see FIG. 1) and the polarity detector 7 (see FIG. 1) are omitted from the embodiment of FIG. 2.

In the embodiment of FIG. 2, the output signals from a limter 4 and a differentiating circuit 5 are multiplied by a multiplier 9. The output signal from the multiplier 9 is applied to an output terminal 8. The output signal from the differentiating circuit 5 which is fed to the multiplier 9 is biased in voltage relative to a ground potential by a dc voltage source 29.

The output signal from the limiter 4 corresponds to components of an input analog signal which have a period equal to a sampling period. the multiplier 9 removes polarity changes from the output signal of the limiter 4 by use of the output signal of the differentiating circuit 5, so that the phase and the waveform of the resultant signal transmitted to the output terminal 8 are essentially independent of whether the level of low-frequency components of the analog signal increases or decreases. Thus, the resultant signal transmitted to the output terminal 8 keeps accurately representing the sampling period.

DESCRIPTION OF THE THIRD PREFERRED EMBODIMENT·

Figure 3:
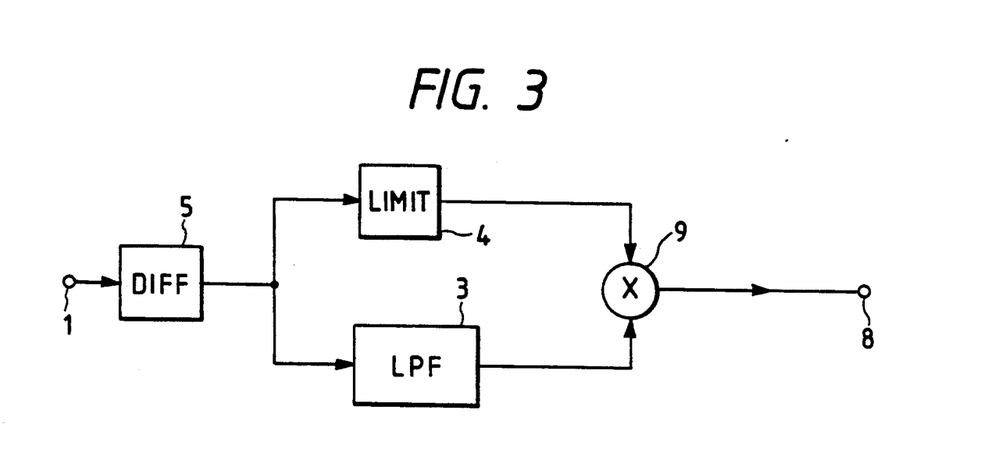
FIG. 3 is a block diagram of an apparatus according to a third embodiment of this invention.

FIG. 3 shows a third embodiment of this invention which is similar to the embodiment of FIG. 2 except for design changes indicated hereinafter. The HPF 2 (see FIG. 2) and the dc voltage source 29 (see FIG. 2) are omitted from the embodiment of FIG. 3.

In the embodiment of FIG. 3, and LPF 3 and a differentiating circuit 5 are exchanged in position relative to the arrangement of the embodiment of FIG. 2. Thus, an input terminal 1 is connected to the differentiating circuit 5, and the output terminal of the LPF 3 is connected to a multiplier 9. Since the differentiating circuit 5 has a function of a high pass filter, the HPF 2 (see FIG. 2) is removed and the output signal from the differentiating circuit 5 is fed to a limiter 4.

Figure 4:
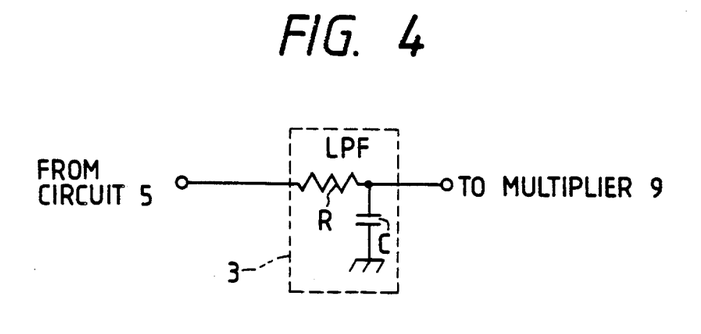
FIG. 4 is a schematic diagram of the low pass filter of FIG. 3.

As shown in FIG. 4, the LPF 3 can be a combination of a resistor R and a capacitor C.

DESCRIPTION OF THE FOURTH PREFERRED EMBODIMENT

Figure 5:
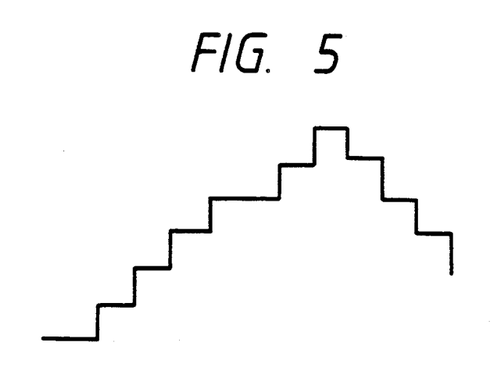
FIG. 5 is a diagram showing an example of the waveform of the output signal from a digital-to-analog converter which has a large amount of low-frequency audio information components.
Figure 6:
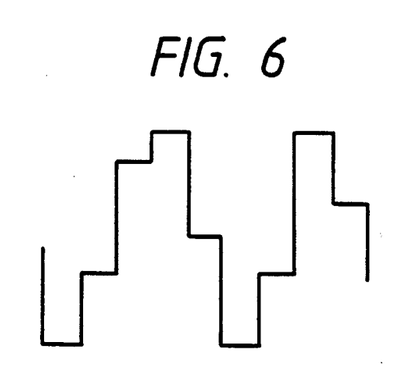
FIG. 6 is a diagram showing an example of the waveform of the output signal from a digital-to-analog converter which has a large amount of high-frequency audio information components.

The principle used by a fourth embodiment of this invention will be explained at first. FIG. 5 shows a stepwise waveform of the output signal from a digital-to-analog converter (not shown) which contains a large amount of low-frequency audio informatiopn components. FIG.6 shows a stepwise waveform of the output signal from the digital-to-analog converter which contains a large amount of high-frequency audio information components. In the signal waveforms of FIGS. 5 and 6, the envelopes represent the audio information components while the steps corresponds to sampling-period components. The sampling-period components have a frequency considerably higher than the frequencies of the audio information components. As understood from FIGS. 5 and 6, the converter output signal containing low-frequecy audio information components has small-height steps and gentle average slopes while the converter output signal containing high-frequency audio information components has large-height steps and steep average slopes.

The gentle average slopes of the signal waveform means that the related signal has a small amount of the sampling-period components. On the other hand, the steep average slopes of the signal waveform means that the related signal has a large amount of the sampling-period components.

Therefore, the stepwise output signal from the digital-to-analog converter contains the sampling-period components whose amount increases with the degree of the average slope of the signal waveform. The sampling-period components have opposite polarities in dependence upon whether or not the slope is upward or downward.

The waveform slope of an audio signal is detected by differentiating the audio signal. The presence of sampling-period signal components whose amount depends on the slope of the audio signal means the presence of amplitude modulated wave components. The sampling-period signal components having opposite polarities represent that the sampling-period signal components are balanced-modulated.

Thus, the output signal from the digital-to-analog converter contains an addition of the audio signal and another signal which is generated by balanced-modulating the sampling-period signal components with the value of differentiation of the audio signal.

As understood from the previous description, the extraction of the sampling-period components from the stepwise output signal of the digital-to-analog converter is similar to the recovery of a carrier from a suppressed-carrier modulated wave. It is known that a Costas-type PLL circuit can be used in recovering a carrier from a suppressed-carrier modulated wave. Accordingly, in cases where the stepwise analog signal outputted from a digital-to-analog converter is differentiated and then the result of the differentiation is fed to a Costas-type PLL circuit, sampling-period components can be accurately extracted from the analog signal.

The above-mentioned principle is used by the fourth embodiment of this invention. The fourth embodiment will now be described in detail.

Figure 7:
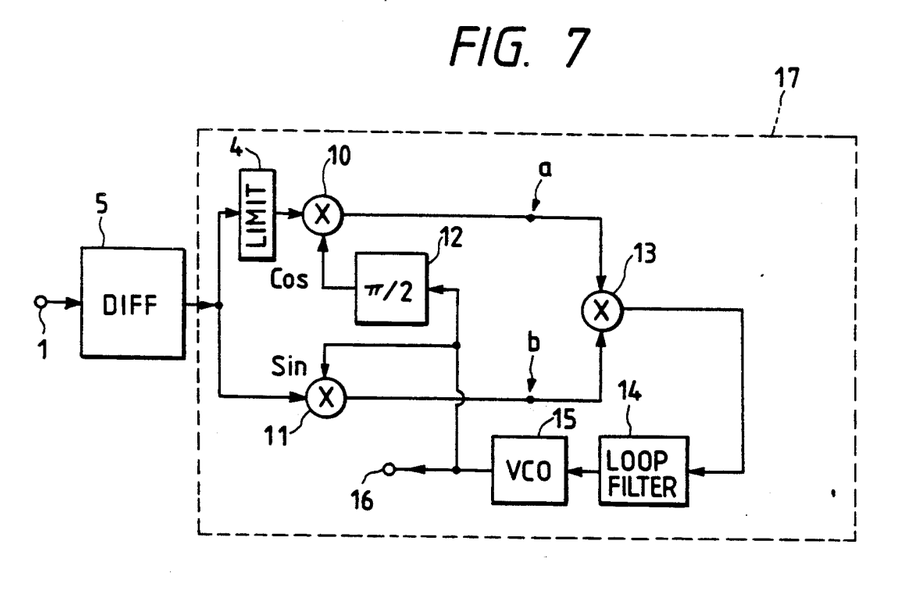
FIG. 7 is a block diagram of an apparatus according to a fourth embodiment of this invention.

With reference to FIG. 7, an input terminal 1 is subjected to an analog signal which is derived from a digital signal through digital-to-analog conversion. The input analog signal is basically separated into information-representing components (audio components) and sampling-period components. Specifically, the analog signal is outputted from a digital-to-analog converter (not shown) and has a stepwise waveform. The analog signal is fed via the input terminal 1 to a differentiating circuit 5 and is differentiated by the circuit 5. The output signal from the differentiating circuit 5 is fed to a Costas-type PLL circuit 17.

The PLL circuit 17 includes a limiter 4, multipliers 10, 11 and 13, a phase shifter 12, a loop filter 14, and a voltage-controlled oscillator (VCO) 15. The VCO 15 outputs a signal equal in phase to sampling-period signal components. The output signal from the VCO 15 is fed to the multiplier 11 as a sine wave. The output signal from the VCO is also fed to a 90-degree phase shifter 12. The phase of the output signal from the VCO 15 is shifted 90 degrees by the phase shifter 12. The output signal from the phase shifter 12 is fed to the multiplier 10 as a cosine wave. In this way, the multipliers 10 and 11 receive quadrature signals respectively.

The output signal from the differentiating circuit 5 is fed to the limiter 4. The amplitude of the output signal from the differentiating circuit 5 is limited by the limiter 4. The output signal from the limiter 4 is applied to the multiplier 10. The multiplier 10 multiplies the output signals from the limiter 4 and the phase shifter 12, and generates a signal representing the phase error between the output signal from the VCO 15 and the sampling-period signal components. The phase error signal is outputted from the multiplier 10 to the multiplier 13 throug a circuit point "a".

The ouput signal from the differentiating circuit 5 is fed to the multiplier 11. The multiplier 11 multiplies the output signals from the differentiating circuit 5 and the VCO 15, and thereby subjects the output signal from the differentiating circuit 5 to sync detection using the output signal from the VCO 15 generates a signal representing a differentiation of the audio signal components. the differentiation signal is outputted from the multiplier 11 to the multiplier 13 through a circuit point "b".

The multiplier 13 multiplies the phase error signal and the differentiation signal and therby changes the polarity of the sampling-period signal components in response to the polarity of the differentiation signal, so that the phase and the waveform of the resultant signal are essentially independent of whether the level of the audio signal components increases or decreases. Thus, the resultant output signal from the multiplier 13 keeps accurately representing the sampling period. The output signal from the multiplier 13 is transmitted to the control terminal of the VCO 15 via the loop filter 14 so that the oscillation frequency of the VCO 15 is controlled by the output signal from the multiplier 13. The output signal from the VCO 15 is applied to an output terminal 16. The signal applied to the output terminal 16 accurately represents the sampling period.

An HPF for cutting off the audio signal components may be connected between the differentiating circuit 5 and the limiter 4. In addition, an amplitude limiter may be connected between the differentiating circuit 5 and the multiplier 11.

DESCRIPTION OF THE FIFTH PREFERRED EMBODIMENT

Figure 8:
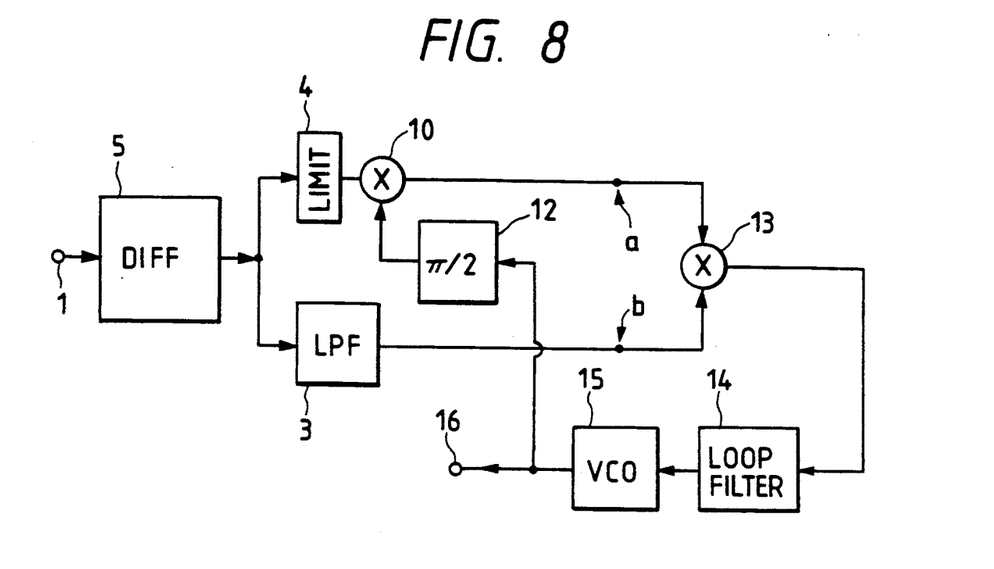
FIG. 8 is a block diagram of an apparatus according to a fifth embodiment of this invention.

FIG. 8 shows a fifth embodiment of this invention which is similar to the embodiment of FIG. 7 except the the multiplier 11 (see FIG. 7) is replaced by an LPF 3.

In the embodiment of FIG. 8, a 90-degree phase shifter 12 may be removed.

DESCRIPTION OF THE SIXTH PREFERRED EMBODIMENT

Figure 9:
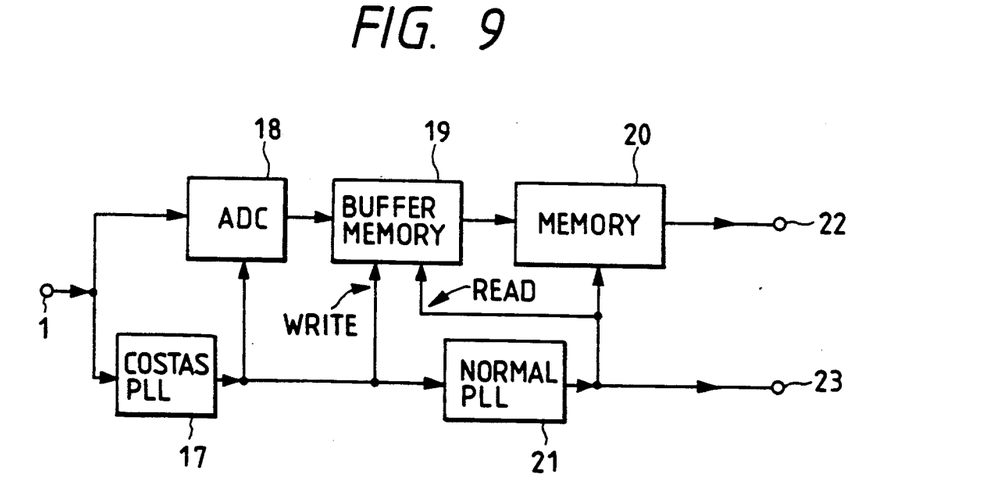
FIG. 9 is a block diagram of an apparatus according to a sixth embodiment of this invention.

With reference to FIG. 9, an input terminal 1 is subjected to an analog signal which is derived from a digital signal through digital-to-analog conversion. The input analog signal is basically separated into information-representing components (audio components) and sampling-period components. Specifically, the analog signal is outputted from a digital-to-analog converter (not shown) and has a stepwise waveform. The analog signal is fed via the input terminal 1 to a differentiating circuit 5 and is differentiated by the circuit 5. The output signal from the differentiating circuit 5 is fed to a Costas-type PLL circuit 17. The Costas-type PLL circuit 17 may be similar to that in the embodiment of FIG. 7. The PLL circuit 17 outputs a signal whose period is accurately equal to the sampling period.

The input analog signal is fed to an analog-to-digital converter 18 via the input terminal 1. The output signal from the PLL circuit 17 is fed to the analog-to-digital converter 18 as a sampling signal. The analog-to-digital converter 18 samples the input analog signal at a timing determined by the sampling signal, and converts the sampled signal into corresponding digital data. The output data from the analog-to-digital converter 18 are written into a buffer memory 19. The timing of the writing of the data into the buffer memory 19 is determined by a write signal composed of the output signal from the PLL circuit 17.

The output signal from the PLL circuit 17 is fed to a PLL circuit 21 of a normal design. The PLL circuit 21 outputs a signal having the sampling period. The output signal from the PLL circuit 21 is fed to the buffer memory 19 as a read signal. The data are read out from the buffer memory 19 at a timing determined by the read signal.

The data read out from the buffer memory 19 are written into a memory 20 within an error correction circuit. The data in the memory 20 are subjected to an error correction process in a known way and are converted into corresponding error-free data. The error-free data are read out from the memory 20 and are fed to an output terminal 22. For example, the error-free data fed to the output terminal 22 are recorded into a recording medium (not shown) by a known recording device. The output signal from the PLL circuit 21 is fed to the memory 20 as a read/write signal.

The output signal from the PLL circuit 21 is also fed to an output terminal 23. For example, the signal fed to the output terminal 23 is used as a clock signal by a servo control section of the recording device.

In cases where the PLL circuit 17 has a quick response characteristic while the PLL circuit 21 has a slow response characteristic, the sampling operation of the analog-to-digital converter 18 can be promptly locked to the input analog signal and the servo control section of the recording device can be well controlled in response to the clock signal fed via the output terminal 23.

The VCO within the PLL circuit 17 or 21 may use a stable oscillation element such as a crystal oscillation element or a lithium tantalate oscillation element. The PLL circuit 17 or 21 may be modified as follows. The VCO generates a clock signal whose frequency is much higher than the sampling frequency, and the clock signal is divided in frequency to generate a sampling signal.

DESCRIPTION OF THE SEVENTH PREFERRED EMBODIMENT

Figure 10:
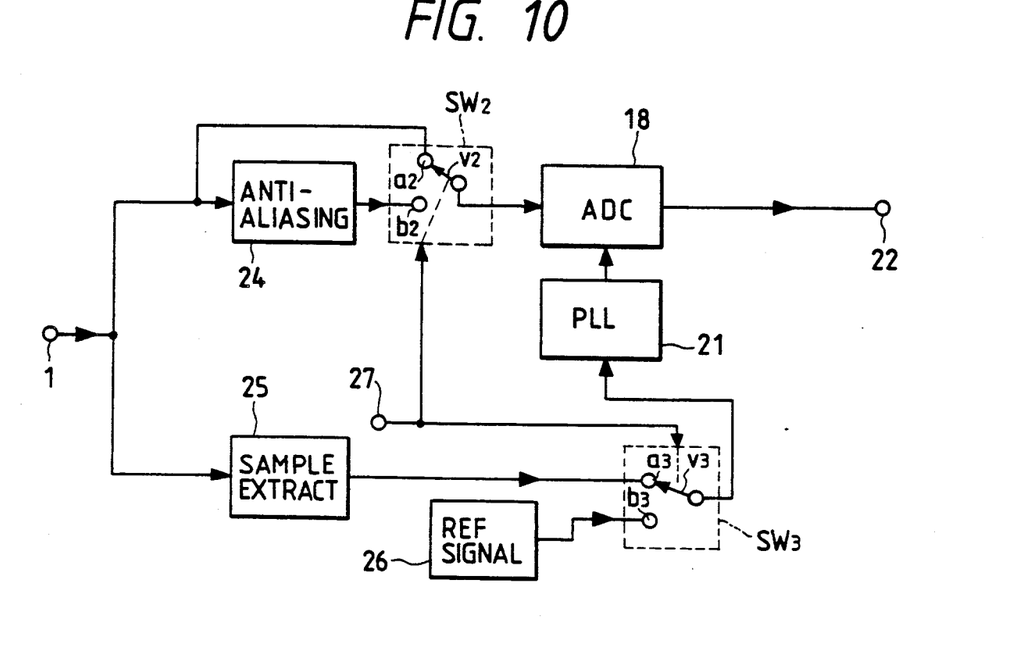
FIG. 10 is a block diagram of an apparatus according to a seventh embodiment of this invention.

FIG. 10 shows a seventh embodiment of this invention which can operate in different first and second modes as will be made clear later. With reference to FIG. 10, an analog signal is fed via an input terminal 1 to an anti-aliasing filter 24, a sampling-signal extracting circuit 25, and a fixed contact a2 of a switch SW2. The input analog signal is of first and second types. The first and second modes of the operation of the apparatus suit to process the first-type analog signal and the second-type analog signal respectively. The first-type analog signal contains sampling-period components while the second-type analog signal lacks sampling-period components. The anti-aliasing filter 24 removes high-frequency components of the input analog signal which would cause aliasing. The output signal from the anti-aliasing filter 24 is fed to a fixed contact b2 of the switch SW2.

A movable contact v2 of the switch SW2 connects with one of the fixed contacts a2 and b2 in response to a change control signal fed via an input terminal 27. The movable contact v2 is connected to the input terminal of an analog-to-digital converter 18. When the movable contact v2 connects with the fixed contact a2 in response to the change control signal, the analog signal applied to the input terminal 1 by-passes the anti-aliasing filter 24 and is directly transmitted to the analog-to-digital converter 18. When the movable contact v2 connects with the fixed contact b2 in response to the change control signal, the output signal from the anti-aliasing filter 24 is transmitted to the analog-to-digital converter 18.

The sampling-signal extracting circuit 25 recovers or extracts a sampling signal from the input analog signal. The sampling-signal extracting circuit 25 is composed of one of the circuits of FIG. 1, FIG. 2, FIG. 3, FIG. 7, and FIG. 8. The output signal from the sampling-signal extracting circuit 25 is fed to a fixed contact a3 of a switch SW3. A reference signal generator 26 outputs a reference signal of a predetermined frequency to a fixed contact b3 of the switch SW3. A movable contact v3 of the switch SW3 connects with one of the fixed contacts a3 and b3 in response to the change control signal fed via the input terminal 27. The movable contact v3 is connected to an input terminal of a PLL circuit 21 of a normal design. When the movable contact v3 connects with the fixed contact a3 in response to the change control signal, the output signal from the sampling-signal extracting circuit 25 is transmitted to the PLL circuit 21. When the movable contact v3 connects with the fixed contact b3 in response to the change control signal, the output signal from the reference signal generator 26 is transmitted to the PLL circuit 21. The PLL circuit 21 generates a sampling signal on the basis of one of the output signals from the devices 25 and 26. The sampling signal is fed from the PLL circuit 21 to the analog-to-digital converter 18.

The analog-to-digital converter 18 samples one of the input analog signal and the output signal from the anti-aliasing filter 24 at a timing determined by the sampling signal, and converts the sampled analog signal into corresponding digital data. The digital data are fed from the analog-to-digital converter 18 to an output terminal 22.

When the input analog signal is of the first type and the first mode of operation of the apparatus is required, the change control signal fed via the input terminal 27 forces the movable contacts v2 and v3 to connect with the fixed contacts a2 and a3 of the switches SW2 and SW3 respectively. In this case, the input analog signal by-passes the anti-aliasing filter 24 and is then fed to the analog-to-digital converter 18. In addition, the analog-to-digital converter 18 samples the input analog signal at a timing determined by the output signal from the sampling-signal extracting circuit 25, and converts the sampled analog signal into corresponding digital data.

When the input analog signal is of the second type and the second mode of operation of the apparatus is required, the change control signal fed via the input terminal 27 forces the movable contact v2 and v3 to connect with the fixed contacts b2 and b3 of the switches SW2 and SW3 respectively. In this case, the input analog signal is processed by the anti-aliasing filter 24, and the output signal from the anti-aliasing filter 24 is fed to the analog-to-digital converter 18. In addition, the analog-to-digital converter 18 samples the output signal from the anti-aliasing filter 24 at a timing determined by the output signal from the reference signal generator 26, and converts the sampled analog signal into corresponding digital data. The second mode of operation corresponds to operation of a conventional apparatus.

DESCRIPTION OF THE EIGHTH PREFERRED EMBODIMENT

Figure 11:
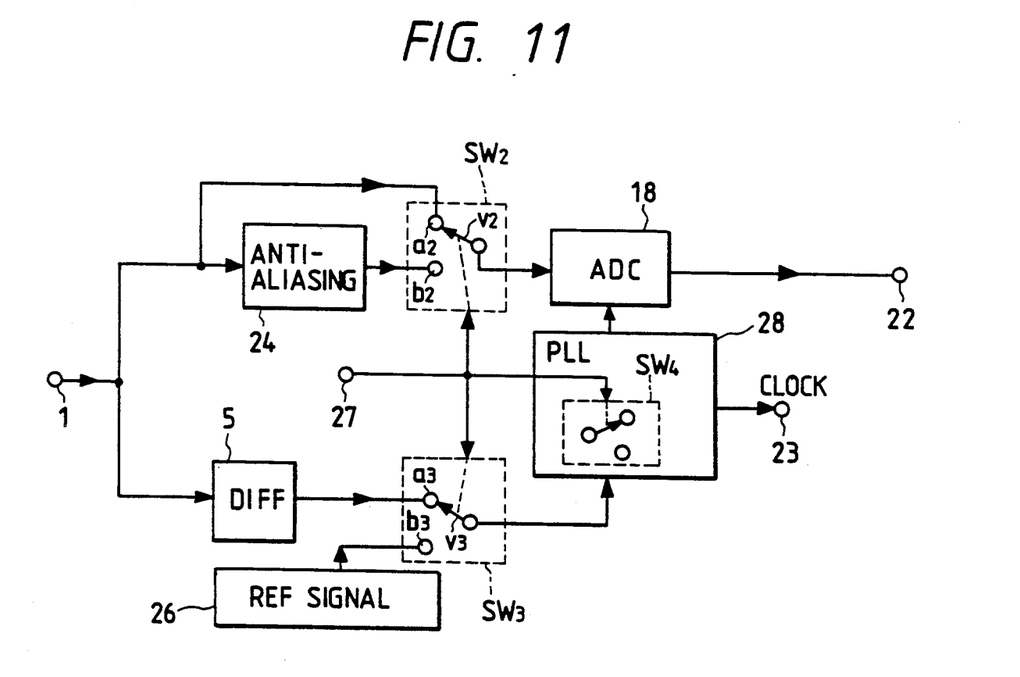
FIG. 11 is a block diagram of an apparatus according to an eighth embodiment of this invention.

FIG. 11 shows an eighth embodiment of this invention which is similar to the embodiment of FIG. 10 except for design changes indicated hereinafter.

In the embodiment of FIG. 11, the sampling-signal extracting circuit 25 (see FIG. 10) is replaced by a differentiating circuit 5. In addition, the PLL circuit 21 (see FIG. 10) is replaced by a PLL block 28. The PLL block 28 outputs a signal to an analog-to-digital converter 18 and also an output terminal 23. The PLL block 28 can selectively serve as one of a Costas-type PLL circuit and a normal-design PLL circuit in response to a change control signal fed via an input terminal 27. The PLL block 28 contains a switch SW4 subjected to the change control signal. The change of the operation of the PLL block 28 is realized by the switch SW4.

When a first mode of operation of the apparatus is required, the change control signal fed via the input terminal 27 forces movable contacts v2 and v3 to connect with fixed contacts a2 and a3 of switches SW2 and SW3 respectively. Simultaneously, the change control signal controls the switch SW4 so that the PLL block 28 will serve as the Costas-type PLL circuit. In this case, an input analog signal applied to an input terminal 1 by-passes an anti-aliasing filter 24 and is then fed to the analog-to-digital converter 18. In addition, the Costas-type PLL circuit 28 generates a sampling signal on the basis of the output signal from the differentiating circuit 5, and the sampling signal is fed to the analog-to-digital converter 18. Therefore, the analog-to-digital converter 18 samples the input analog signal at a timing determined by the sampling signal, and converts the sampled analog signal into corresponding digital data.

When a second mode of operation of the apparatus is required, the change control signal fed via the input terminal 27 forces the movable contacts v2 and v3 to connect with fixed contacts b2 and b3 of the switches SW2 and SW3 respectively. Simultaneously, the change control signal controls the switch SW4 so that the PLL block 28 will serve as the normal-design PLL circuit. In this case, the input analog signal is processed by the anti-aliasing filter 24, and the output signal from the anti-aliasing filter 24 is fed to the analog-to-digital converter 18. In addition, the normal-design PLL circuit 28 generates a sampling signal on the basis of the output signal from a reference signal generator 26, and the sampling signal is fed to the analog-to-digital converter 18. Therefore, the analog-to-digital converter 18 samples the output signal from the anti-aliasing filter 24 at a timing determined by the sampling signal, and converts the sampled analog signal into corresponding digital data.

Figure 12:
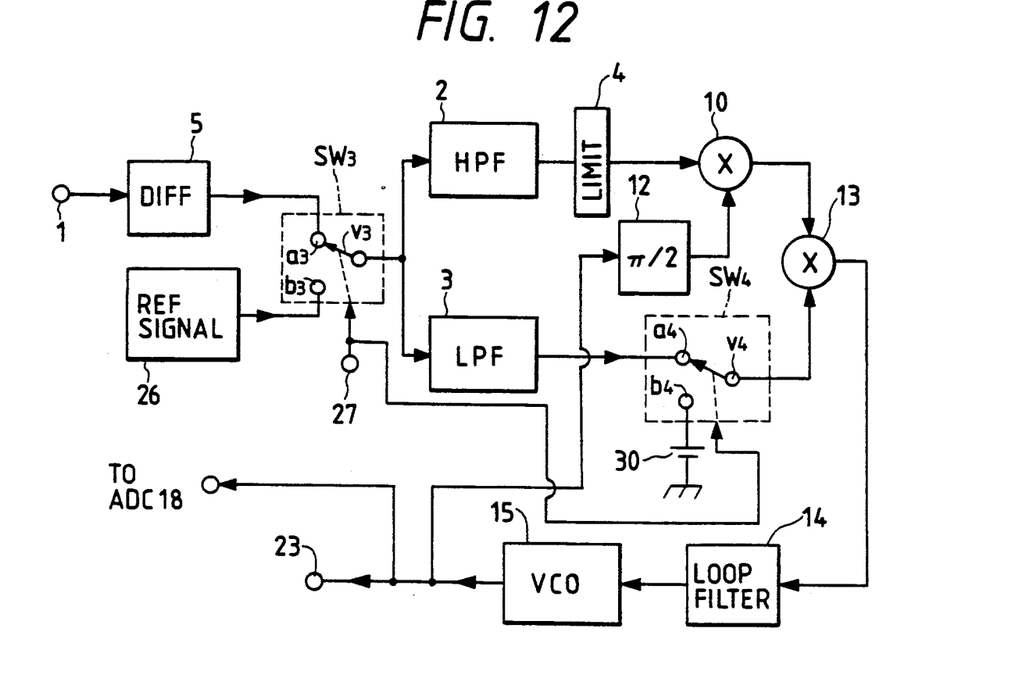
FIG. 12 is a block diagram of the PLL circuit of FIG. 11.

As shown in FIG. 12, the PLL block 28 includes an HPF 2, an LPF 3, a limiter 4, the switch SW4, multipliers 10 and 13, a 90-degree phase shifter 12, a loop filter 14, a VCO 15, and a constant voltage source 30. One of the output signals from the devices 5 and 26 is fed via the switch SW3 to the HPF 2 and the LPF 3. The amplitude of the output signal from the HPF 2 is limited by the limiter 4. The output signal from the limiter 4 is applied to the multiplier 10. The phase of the output signal from the VCO 15 is shifted by 90 degrees by the phase shifter 12. The output signal from the phase shifter 12 is fed to the multiplier 10. The multiplier 10 multiplies the output signals from the devices 4 and 12. The output signal from the multiplier 10 is applied to the multiplier 13.

The output signal from the LPF 3 is fed to a fixed contact a4 of the switch SW4. The constant voltage source 30 applies a constant potential to a fixed contact b4 of the switch SW4. A movable contact v4 of the switch SW4 connects with one of the fixed contacts a4 and b4 in response to the change control signal fed via the input terminal 27. The movable contact v4 is connected to the multiplier 13. When the movable contact v4 connects with the fixed contact a4 in response to the change control signal, the output signal from the LPF 3 is transmitted to the multiplier 13. When the movable contact v4 connects with the fixed contact b4 in response to the change control signal, the constant potential of the constant voltage source 30 is transmitted to the multiplier 13. In this way, one of the output signal from the LPF 3 and the constant potential is selectively transmitted to the multiplier 13.

The multiplier 13 multiplies the output signal from the multiplier 10 and the signal fed via the switch SW4. The output signal from the multiplier 13 is transmitted via the loop filter 14 to the control terminal of the VCO 15. The VCO 15 generates a signal whose frequency is controlled by the output signal from the multiplier 13. The output signal from the VCO 15 is fed to the phase shifter 12, the analog-to-digital converter 18, and the output terminal 23.

When the PLL block 28 is required to serve as the Costas-type PLL circuit, the change control signal forces the movable contact v4 to connect with the fixed contact a4 of the switch SW4 so that the output signal from the LPF 3 is fed to the multiplier 13. In this case, the PLL block 28 operates similar to the Costas-type PLL circuit of FIG. 8.

When the PLL block 28 is required to serve as the normal-design PLL circuit, the change control signal forces the movable contact v4 to connect with the fixed contact b4 of the switch SW4 so that the constant potential of the constant voltage source 30 is fed to the multiplier 13. In this case, the output signal from the multiplier 10 passes through the multiplier 13 essentially without undergoing any processing and is then transmitted to the VCO 15 through the loop filter 14. Accordingly, the PLL block 28 serves as the normal-design PLL circuit.

DESCRIPTION OF THE NINTH PREFERRED EMBODIMENT

Figure 13:
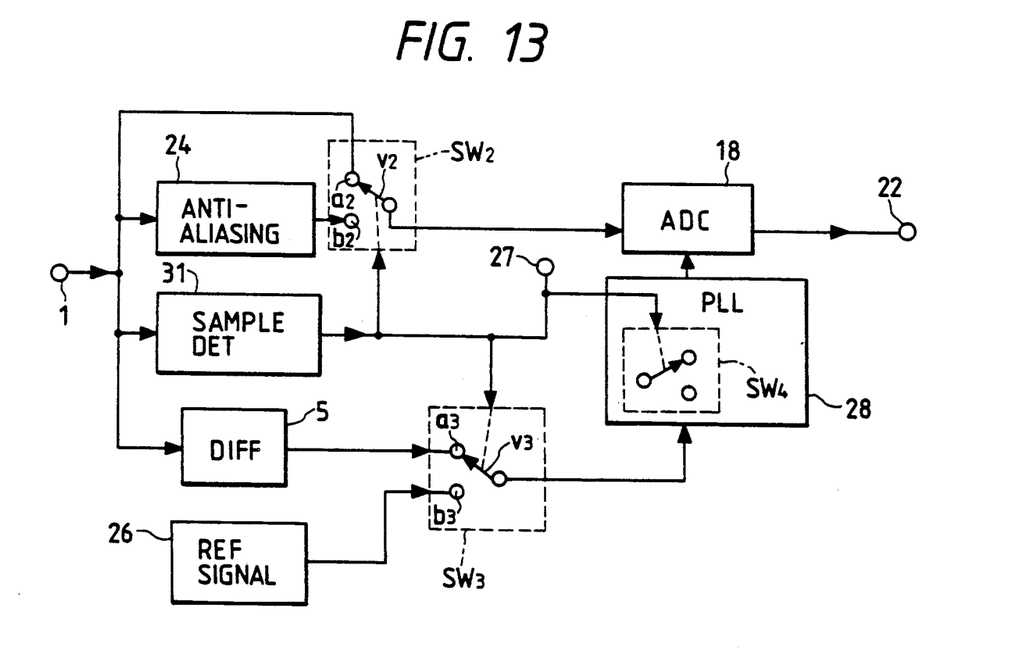
FIG. 13 is a block diagram of an apparatus according to a ninth embodiment of this invention.

FIG. 13 shows a ninth embodiment of this invention which is similar to the embodiment of FIGS. 11 and 12 except that a sampling signal detector 31 is added. The sampling signal detector 31 receives an analog signal via an input terminal 1. The sampling signal detector 31 generates a change control signal on the basis of the input analog signal, and outputs the change control signal to the switches SW2–SW4. The sampling signal detector 31 detects whether or not sampling-period components are present in the input analog signal. When the sampling signal detector 31 detects the presence of sampling-period components in the input analog signal, the sampling signal detector 31 controls the switches SW2–SW4 so that the apparatus will operate in a first mode. When the sampling signal detector 31 detects the absence of sampling-period components from the input analog signal, the sampling signal detector 31 controls the switches SW2–SW4 so that the apparatus will operate in a second mode.

DESCRIPTION OF THE TENTH PREFERRED EMBODIMENT

Figure 14:
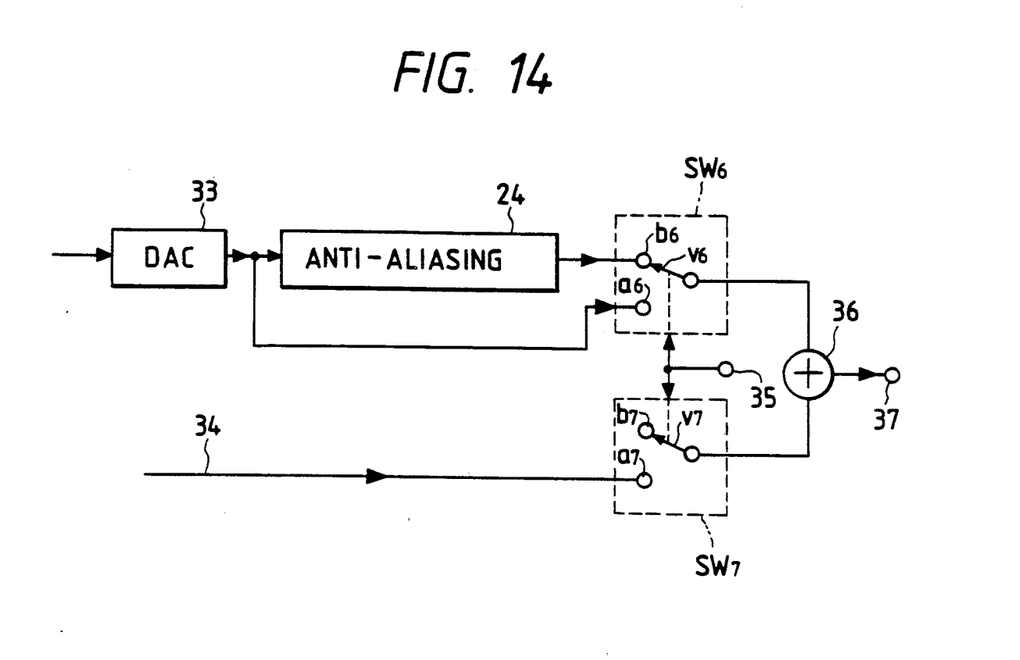
FIG. 14 is a block diagram of an apparatus according to a tenth embodiment of this invention.

FIG. 14 shows a reproducing part of an apparatus according to a tenth embodiment of this invention. As shown in FIG. 14, a digital-to-analog converter 33 outputs an analog signal of a stepwise waveform to an anti-aliasing filter 24 and a fixed contact a6 of a switch SW6. The anti-aliasing filter 24 removes high-frequency components from the analog signal which would cause aliasing. The output signal from the anti-aliasing filter 24 is fed to a fixed contact b6 of the switch SW6. A movable contact v6 of the switch SW6 connects with one of the fixed contacts a6 and b6 in response to a change control signal fed via an input terminal 35. The movable contact v6 is connected to a first input terminal of an adder 36. When the movable contact v6 connects with the fixed contact a6 in response to the change control signal, the analog output signal from the digital-to-analog converter 33 by-passes the anti-aliasing filter 24 and is then transmitted to the adder 36. When the movable contact v6 connects with the fixed contact b6 in response to the change control signal, the analog output signal from the digital-to-analog converter 33 is processed by the anti-aliasing filter 24 and the output signal from the anti-aliasing filter 24 is transmitted to the adder 36.

A fixed contact a7 of a switch SW7 receives a reference signal via a signal feed line 34. The period of the reference signal has a predetermined relation with a period of sampling in the digital-to-analog converter 33. The reference signal is generated by a suitable device using a sampling signal fed to the digital-to-analog converter 33. A fixed contact b7 of the switch SW7 is in no-connection. A movable contact v7 of the switch SW7 connects with one of the fixed contacts a7 and b7 in response to the change control signal fed via the input terminal 35. The movable contact v7 is connected to a second input terminal of the adder 36. When the movable contact v7 connects with the fixed contact a7 in response to the change control signal, the reference signal is transmitted to the adder 36. When the movable contact v7 connects with the fixed contact b7 in response to the change control signal, the transmission of the reference signal to the adder 36 is inhibited.

The adder 36 adds the signals fed via the switches SW6 and SW7. The output signal from the adder 36 is fed to an output terminal 37.

The apparatus of FIG. 14 can operate in first and second modes selected by the change control signal. When the first mode of operation is required, the change control signal forces the movable contacts v6 and v7 to connect with the fixed contacts a6 and a7 of the switches SW6 and SW7 respectively. In this case, the output analog signal from the digital-to-analog converter 33 by-passes the anti-aliasing filter 24 and is then added with the reference signal, and the resultant signal is fed to the output terminal 37. When the second mode of operation is required, the change control signal forces the movable contacts v6 and v7 to connect with the fixed contacts b6 and b7 of the switches SW6 and SW7 respectively. In this case, the output analog signal from the digital-to-analog converter 33 is processed by the anti-aliasing filter 24, and the output signal from the anti-aliasing filter 24 is transmitted to the output terminal 37 without undergoing any processing.

The reference signal can be used in a recording part of an apparatus to derive a sampling-period signal for accurately synchronizing analog-to-digital conversion with the digital-to-analog conversion by the converter 33.

DESCRIPTION OF THE ELEVENTH PREFERRED EMBODIMENT

Figure 15:
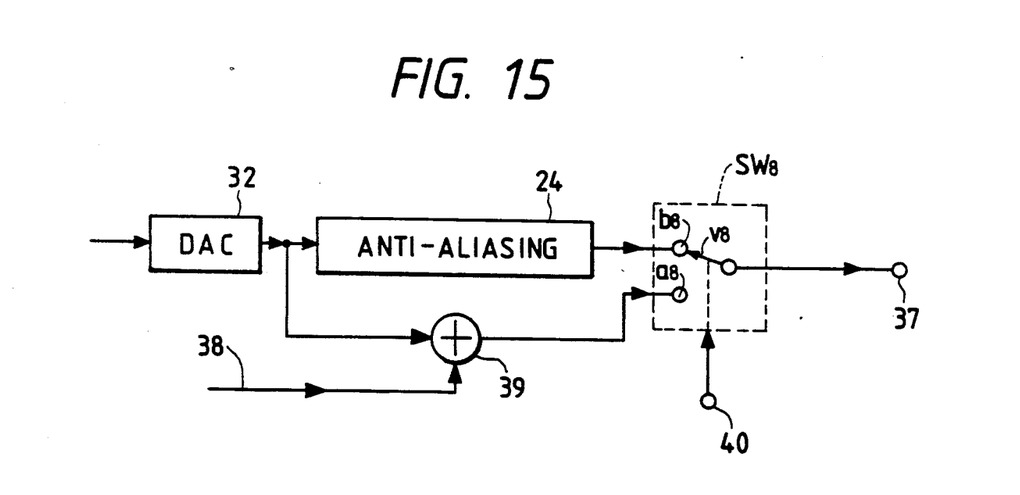
FIG. 15 is a block diagram of an apparatus according to an eleventh embodiment of this invention.

FIG. 15 shows an eleventh embodiment of this invention which is similar to the embodiment of FIG. 14 except for design changes indicated hereinafter. In the embodiment of FIG. 15, the output signal from a digital-to-analog converter 33 is fed to an anti-aliasing filter 24 and also a first input terminal of an adder 39. A second input terminal of the adder 39 receives a reference signal via a signal feed line 38. As in the embodiment of FIG. 14, the period of the reference signal has a predetermined relation with a period of sampling in the digital-to-analog converter 33. The adder 39 adds the output signal from the digital-to-analog converter 33 and the reference signal. The output signal from the adder 39 is fed to a fixed contact a8 of a switch SW8. The output signal from the anti-aliasing filter 24 is fed to a fixed contact b8 of the switch SW8. A movable contact v8 of the switch SW8 selectively connects with one of the fixed contacts a8 and b8 in response to a change control signal fed via an input terminal 40. The movable contact v8 is connected to an output terminal 37. When the movable contact v8 connects with the fixed contact a8 in response to the change control signal, the output signal from the adder 39 is transmitted to the output terminal 37. When the movable contact v8 connects with the fixed contact b8 in response to the change control signal, the output signal from the anti-aliasing filter 24 is transmitted to the output terminal 37.

Similarly to the apparatus of FIG. 14, the apparatus of FIG. 15 can operate in first and second modes selected by the change control signal.

What is claimed is:

1. An apparatus for detecting a sampling-period sync signal from an output signal of a digital-to-analog converter, the apparatus comprising:
   means for extracting sampling-period components from the output signal of the digital-to-analog converter;
   means for extracting low-frequency components of the output signal of the digital-to-analog converter;
   means for detecting whether a level of the low-frequency components increases or decreases and for generating a detection signal representative thereof; and
   means responsive to the detection signal for changing a polarity of the sampling-period components in response to whether the level of the low-frequency components increases or decreases.

2. An apparatus for detecting a sampling-period sync signal from an output signal of a digital-to-analog converter, the apparatus comprising:
   means for extracting sampling-period components from the output signal of the digital-to-analog converter;
   means for generating a signal depending on whether a level of low-frequency components of the output signal of the digital-to-analog converter increases or decreases; and
   means for multiplying said signal and the sampling-period components.

3. An apparatus for detecting a sampling-period sync signal from an output signal of a digital-to-analog converter, the apparatus comprising:
   a differentiating circuit differentiating the output signal of the digital-to-analog converter; and
   a PLL circuit operating with an output signal from the differentiating circuit to derive a sampling-period sync signal;
   wherein the PLL circuit comprises:
   a voltage-controlled oscillator;
   a phase shifter shifting a phase of an output signal from the voltage-controlled oscillator by 90 degrees;
   a first multiplier multiplying an output signal from the differentiating circuit and an output signal from the phase shifter;
   a low pass filter processing the output signal from the differentiating circuit;
   a second multiplier multiplying an output signal from the first multiplier and an output signal from the low pass filter; and
   a loop filter processing an output signal from the second multiplier;
   the voltage controlled oscillator having a control terminal receiving an output signal from the loop filter.

4. A recording apparatus comprising:
   a differentiating circuit differentiating an input analog signal;
   a Costas-type PLL circuit operating with an output signal from the differentiating circuit and generating a first timing signal having a period equal to a period of sampling-period components of the input analog signal;
   an analog-to-digital converter sampling the input analog signal in response to the first timing signal and converting the sampled input analog signal into a corresponding digital signal;
   a buffer memory storing the digital signal in response to the first timing signal and outputting the digital signal in response to a second timing signal;
   a normal-design PLL circuit generating the second timing signal on the basis of the first timing signal; and
   a memory within an error correction circuit for storing the digital signal outputted from the buffer memory in response to the second timing signal;
   wherein the second timing signal constitutes a clock signal for servo control.

5. A recording apparatus comprising:
   means for extracting a first sampling-frequency signal from an input analog signal;
   means for generating a reference-frequency signal;
   first selecting means for selecting either the first sampling-frequency signal or the reference-frequency signal;
   a PLL circuit generating a second sampling-frequency signal on the basis of the signal selected by the first selecting means;
   an anti-aliasing filter processing the input analog signal;
   second selecting means for selecting either the input analog signal or an output signal from the anti-aliasing filter;
   means for controlling the first and second selecting means; and
   an analog-to-digital converter sampling the signal selected by the second selecting means in response to the second sampling-frequency signal and converting the sampled signal into a corresponding digital signal.

6. A recording apparatus comprising:
   a differentiating circuit differentiating an input analog signal;
   means for generating a reference-frequency signal;
   first selecting means for selecting either an output signal from the differentiating circuit or the reference-frequency signal;
   a PLL circuit generating a sampling-frequency signal on the basis of the signal selected by the first selecting means;
   means for changing the PLL circuit between a normal-design PLL circuit and a Costas-type PLL circuit;
   an anti-aliasing filter processing the input analog signal;
   second selecting means for selecting either the input analog signal or an output signal from the anti-aliasing filter;
   means for controlling the first selecting means, the second selecting means and the PLL circuit changing means; and
   an analog-to-digital converter sampling the signal selected by the second selecting means in response to the sampling-frequency signal and converting the sampled signal into a corresponding digital signal.

7. A recording apparatus comprising:
   a differentiating circuit differentiating an input analog signal;
   means for generating a reference-frequency signal;
   first selecting means for selecting either an output signal from the differentiation circuit or the reference-frequency signal;

a PLL circuit generating a sampling-frequency signal on the basis of the signal selected by the first selecting means;

means for changing the PLL circuit between a normal-design PLL circuit and a Costas-type PLL circuit;

an anti-aliasing filter processing the input analog signal;

second selecting means for selecting either the input analog signal or an output signal from the anti-aliasing filter;

an analog-to-digital converter sampling the signal selected by the second selecting means in response to the sampling-frequency signal and converting the sampled signal into a corresponding digital signal; and means for detecting whether or not sampling-frequency components are present in the input analog signal, and for controlling the first selecting means, the second selecting means, and the PLL circuit changing means in response to whether or not the sampling-frequency components are present in the input analog signal.

8. A reproducing apparatus comprising:

a digital-to-analog converter;

an anti-aliasing filter processing an output signal from the digital-to-analog converter;

an adder having first and second input terminals and adding signals fed to the first and second input terminals;

means for selecting either the output signal from the digital-to-analog converter or an output signal from the anti-aliasing filter, and for feeding said selected output signal from the digital-to-analog converter or the anti-aliasing filter to the first input terminal of the adder;

means for selectively enabling and inhibiting a feed of a reference signal to the second input terminal of the adder, wherein a period of the reference signal has a predetermined relation with a period of sampling in the digital-to-analog converter; and means for controlling the selecting means and the enabling and inhibiting means.

9. A reproducing apparatus comprising:

a digital-to-analog converter;

an anti-aliasing filter processing an output signal from the digital-to-analog converter;

an adder adding an output signal from the digital-to-analog converter and a reference signal of a period which has a predetermined relation with a period of sampling in the digital-to-analog converter;

means for selecting either an output signal from the anti-aliasing filter or an output signal from the adder and for outputting said selected output signal from the anti-aliasing filter or the adder; and;

means for controlling the selecting means.

10. A method of detecting a sampling-period sync signal from an output signal of a digital-to-analog converter, the method comprising the steps of:

extracting sampling-period components from the output signal of the digital-to-analog converter;

extracting low-frequency components of the output signal of the digital-to-analog converter;

detecting whether a level of the low-frequency components increases or decreases; and changing a polarity of the sampling-period components in response to whether the level of the low-frequency components increases or decreases.

11. A method of detecting a sampling-period sync signal from an output signal of a digital-to-analog converter, the method comprising the steps of:

extracting sampling-period components from the output level signal of the digital-to-analog converter;

generating a signal depending on whether a level of low-frequency components of the output level signal of the digital-to-analog converter increases or decreases; and multiplying said signal and the sampling-period components.

* * * * *